(12) United States Patent
Yang et al.

(10) Patent No.: US 10,014,431 B2
(45) Date of Patent: Jul. 3, 2018

(54) THIN FILM SOLAR CELL AND METHOD OF FABRICATING THE SAME

(71) Applicant: Daegu Gyeongbuk Institute of Science and Technology, Daegu (KR)

(72) Inventors: Kee Jeong Yang, Daegu (KR); Bo Ram Jeon, Gyeongsangbuk-Do (KR); Jun Hyoung Sim, Daegu (KR); Dae Ho Son, Gyeonggi-Do (KR); Jin Kyu Kang, Daegu (KR)

(73) Assignee: Daegu Gyeongbuk Institute of Science and Technology, Daegu (KR)

( * ) Notice: Subject to any disclaimer, the term of this patent is extended or adjusted under 35 U.S.C. 154(b) by 0 days.

(21) Appl. No.: 15/139,479

(22) Filed: Apr. 27, 2016

(65) Prior Publication Data

US 2016/0315212 A1 Oct. 27, 2016

Related U.S. Application Data

(62) Division of application No. 14/466,270, filed on Aug. 22, 2014.

(30) Foreign Application Priority Data

Aug. 22, 2013 (KR) ........................ 10-2013-0099643

(51) Int. Cl.
*H01L 31/18* (2006.01)
*C23C 14/58* (2006.01)
(Continued)

(52) U.S. Cl.
CPC ............ *H01L 31/18* (2013.01); *C23C 14/185* (2013.01); *C23C 14/34* (2013.01);
(Continued)

(58) Field of Classification Search
CPC ............ H01L 31/0326; H01L 31/0327; H01L 31/0322; H01L 31/0323; H01L 31/0749
See application file for complete search history.

(56) References Cited

U.S. PATENT DOCUMENTS 4,976,779 A * 12/1990 Webwer ................ B22F 1/0088
148/284
2008/0311487 A1 * 12/2008 Ito ........................... B24B 37/22
430/5

(Continued)

OTHER PUBLICATIONS

"Metals—Melting Temperatures" [retrieved from http://web.archive.org/web/20120806211103/http://www.engineeringtoolbox.com/melting-temperature-metals-d_860.html on Mar. 13, 2017].*

(Continued)

*Primary Examiner* — Eric R Smith
(74) *Attorney, Agent, or Firm* — Mintz Levin Cohn Ferris Glovsky and Popeo, P.C.; Kongsik Kim; Joohee Lee

(57) ABSTRACT

Disclosed is a thin film solar cell including a substrate, a first electrode, a light absorbing layer, a buffer layer, a window layer, and a second electrode, wherein a compound layer of $M_xS_y$ or $M_xSe_y$ (here, M is metal, and x and y each are a natural number) is present in an interface between the first electrode and the light absorbing layer, the thickness of the compound layer of $M_xS_y$ or $M_xSe_y$ being 150 nm or less.

8 Claims, 15 Drawing Sheets

(51) Int. Cl.
*C23C 14/34* (2006.01)
*H01L 31/0392* (2006.01)
*C23C 14/18* (2006.01)
*H01L 31/0224* (2006.01)

(52) U.S. Cl.
CPC ...... *C23C 14/5806* (2013.01); *C23C 14/5866* (2013.01); *H01L 31/022425* (2013.01); *H01L 31/03923* (2013.01); *Y02E 10/541* (2013.01); *Y02P 70/521* (2015.11)

(56) References Cited

U.S. PATENT DOCUMENTS

| 2013/0037090 A1* | 2/2013 | Bag ................. H01L 31/0326 136/252 |
| 2013/0104972 A1* | 5/2013 | Jeong ............. H01L 31/022425 136/256 |
| 2013/0213478 A1* | 8/2013 | Munteanu ........... H01L 21/2254 136/264 |
| 2013/0269764 A1* | 10/2013 | Barkhouse ...... H01L 31/022425 136/256 |

OTHER PUBLICATIONS

Jun-Ho Cha, et al., "Effect of thermal annealing on the structure, morphology, and electrical properties of Mo bottom electrodes for solar cell applications", Journal of the Korean Physical Society, 59(3), p. 2280-2285. (Year: 2011).*

* cited by examiner

THIN FILM SOLAR CELL AND METHOD OF FABRICATING THE SAME

CROSS-REFERENCE TO RELATED APPLICATIONS

This application is a divisional application of application Ser. No. 14/466,270 filed on Aug. 22, 2014, which claims priority to Korean Application No. 10-2013-0099643 filed on Aug. 22, 2013, which applications are incorporated herein by reference.

BACKGROUND OF THE INVENTION

1. Field of the Invention

The present invention relates to a thin film solar cell and a method for manufacturing the same, and more particularly, to a method for manufacturing a thin film solar cell having improved light conversion efficiency through a heat treatment process of a first electrode.

2. Description of the Prior Art

Chalcopyrite-based solar cell technology is highly likely to ensure high efficiency in all thin film solar cell technologies. $CuInSe_2$, $CuInS_2$, $Cu(In,Ga)Se_2$, or the like, is used for the thin film solar cell. However, the solar cell having this composition has difficulty in realizing a low priced thin film solar cell since the reserve of indium (In) is restricted and the material cost of indium (In) is expensive.

A thin film solar cell having a light absorbing layer of CZTS ($Cu_2ZnSn(S,Se)_4$) has been suggested as an alternative to solve the problem. The CZTS-based solar cell enables the realization of low-priced solar cells since the material constituting the light absorbing layer is widely available on Earth.

However, the efficiency of the thin film solar cell is so low that the thin film solar cell cannot be applied for general purposes. Particularly, when a thin film of the thin film solar cell is formed, the light conversion efficiency may be lowered due to a mixed-phase compound formed on an interface between layers. Therefore, the development of a process for forming a material constituting the light absorbing layer, the control of respective thin films constituting all devices, and the control of the interface between thin films are needed to improve the efficiency of the thin film solar cell.

SUMMARY

The present invention has been made in view of the above-mentioned problems, and an aspect of the present invention is to provide a method for manufacturing a thin film solar cell to suppress the generation of a mixed-phase compound ($M_xS_y$ or $M_xSe_y$) in an interface between a first electrode and a light absorbing layer.

Another embodiment of the present invention is to provide a method for manufacturing a thin film solar cell to suppress the defects of grain boundaries of a light absorbing layer by controlling the diffusion of Na and O from a substrate to the first electrode.

Still another embodiment of the present invention is to provide a thin film solar cell having excellent current-voltage characteristics and light conversion efficiency.

In order to accomplish these objects, there is provided a thin film solar cell including a substrate, a first electrode, a light absorbing layer, a buffer layer, a window layer, and a second electrode, wherein a compound layer of $M_xS_y$ or $M_xSe_y$ (here, M is metal, and x and y are a natural number) is present in an interface between the first electrode and the light absorbing layer, the thickness of the compound layer of $M_xS_y$ or $M_xSe_y$ being 150 nm or less.

In an embodiment of the present invention, M may be molybdenum (Mo), nickel (Ni), tungsten (W), cobalt (Co), titanium (Ti), copper (Cu), gold (Au), or an alloy thereof.

In an embodiment of the present invention, M may be molybdenum (Mo).

In an embodiment of the present invention, the thickness of the compound layer of $M_xS_y$ or $M_xSe_y$ may be 130 nm or less.

In an embodiment of the present invention, the first electrode may be 0.2 μm to 5 μm.

In an embodiment of the present invention, the light absorbing layer may be CIS, CIGS, or CZTS.

In an embodiment of the present invention, the surface roughness of the first electrode may be 4 nm or less.

In an embodiment of the present invention, the sheet resistance value of the first electrode may be 0.7 ohms/square or less.

In accordance with another embodiment of the present invention, there is provided a method for manufacturing a CZTS-based thin film solar cell, the method including: preparing a substrate (S1); forming a first electrode on the substrate (S2); heat-treating the first electrode at a temperature of $\frac{1}{3}*T_m$ to $\frac{1}{2}*T_m$ based on the melting temperature ($T_m$) of the first electrode (S3); depositing a metallic precursor on the heat-treated first electrode (S4); and heat-treating the deposited metallic precursor layer under sulfurization or selenization gas atmosphere to form a light absorbing layer (S5).

In an embodiment of the present invention, after step S4, Na and O may be present on a surface of the first electrode.

In an embodiment of the present invention, the first electrode may be a molybdenum (Mo) thin film.

In an embodiment of the present invention, the temperature for the heat treatment may be 400-600° C.

In an embodiment of the present invention, the temperature for the heat treatment may be 500-600° C.

In an embodiment of the present invention, the pressure for the heat treatment may be 400-760 Torr.

In an embodiment of the present invention, in step S4, a CZT-based metallic precursor layer may be formed by sequentially depositing a Zn precursor, a Sn precursor, and a Cu precursor on the first electrode.

In an embodiment of the present invention, the metallic precursor layer may be formed by any one selected from sputtering, evaporation, chemical vapor deposition, metal organic chemical vapor deposition (MOCVD), close-spaced sublimation (CSS), spray pyrolysis, chemical spraying, screen printing, vacuum-free liquid-phase film deposition, chemical bath deposition (CBD), vapor transport deposition (VTD), and electrodeposition.

In an embodiment of the present invention, the method may further include: forming a buffer layer on the light absorbing layer (S6); forming a window layer on the buffer layer (S7); and forming a second electrode on the window layer (S8).

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION

Hereinafter, the present invention will be described in detail based on embodiments of the present invention. However, the following embodiments are provided merely for examples of the present invention, and the present invention is not limited thereto. The present invention can be modified in various ways and applied within the claims below and the equivalent range that could be interpreted from the claims.

Figure 1:
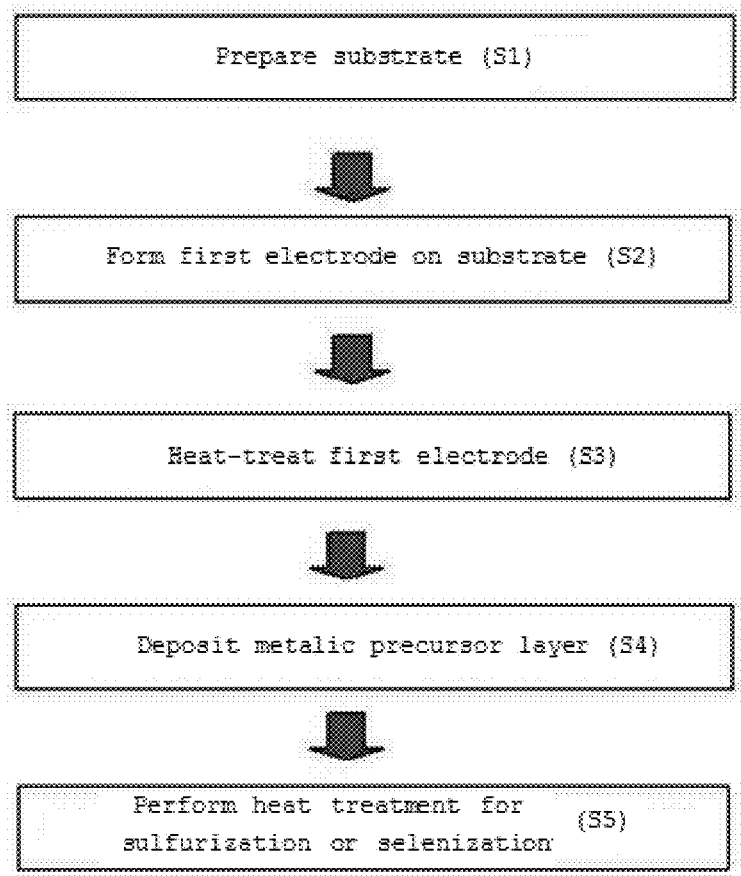
FIG. 1 and FIG. 2 are flow charts illustrating processes for manufacturing a thin film solar cell according to embodiments of the present invention.
Figure 2:
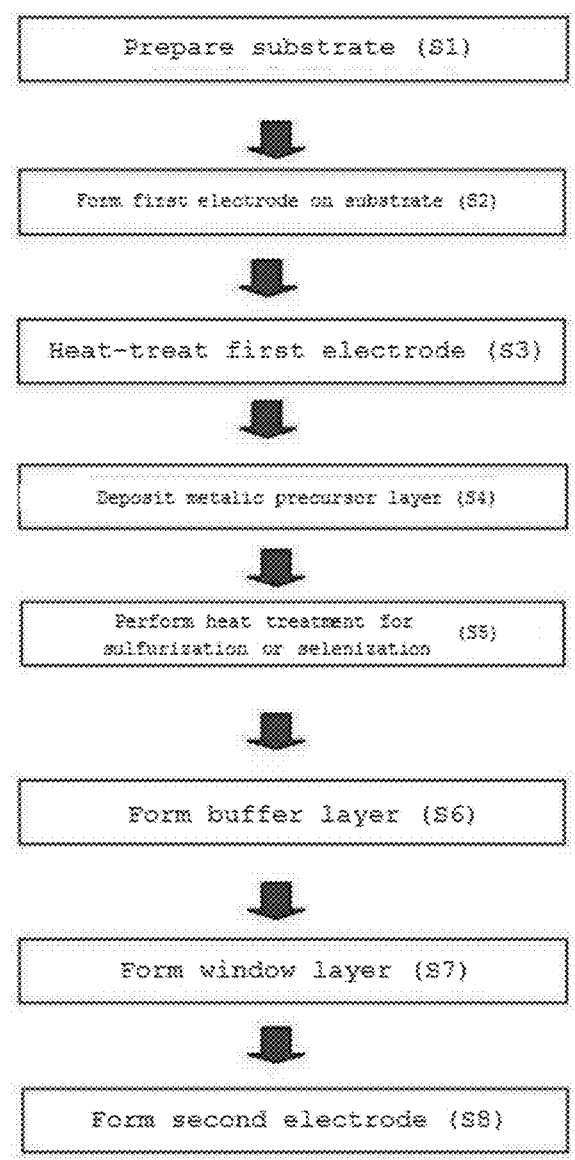

The present invention provides a method for manufacturing a CZTS-based thin film solar cell. FIG. 1 and FIG. 2 are flow charts illustrating processes for manufacturing a thin film solar cell according to embodiments of the present invention.

Referring to FIG. 1, an embodiment of the present invention includes: preparing a substrate (S1); forming a first electrode on the substrate (S2); heat-treating the first electrode (S3); depositing a metallic precursor on the first electrode (S4); and heat-treating the deposited metallic precursor layer under sulfurization or selenization gas atmosphere to form a light absorbing layer (S5).

Referring to FIG. 2, an embodiment of the present invention may further include, in addition to steps (S1) to (S4): forming a buffer layer on the light absorbing layer (S6); forming a window layer on the buffer layer (S7); and forming a second electrode on the window layer (S8).

The method for manufacturing the thin film solar cell of the present invention is characterized by including the step of heat-treating the first electrode to improve efficiency of the solar cell, and the application range of the present invention is not particularly limited as long as the efficiency of the cell is improved.

Hereinafter, respective steps are specifically set forth.

According to an embodiment of the present invention, in the step of preparing a substrate (S1), a transparent insulating material may be used as the substrate (100). Specifically, glass, ceramic, or metal may be used as the substrate (100), and soda lime glass, borosilicate glass, and alkali free glass substrates are also included. Meanwhile, for example, compositions thereof are as shown in table 1.

TABLE 1

| | | Soda lime glass | | Borosilicate glass | | Alkali free glass | |
|---|---|---|---|---|---|---|---|
| Compositon | $SiO_2$ | 73.0 | $SiO_2$ | 80.6 | $SiO_2$ | 54.4 |
| | $Na_2O$ | 14.0 | $B_2O_3$ | 13.0 | $Al_2O_3$ | 15 |
| | CaO | 7.0 | $Na_2O$ | 4.0 | CaO | 17 |
| | MgO | 4.0 | $Al_2O_3$ | 2.3 | MgO | 5 |
| | $Al_2O_3$ | 2.0 | Etc | 0.1 | $B_2O_3$ | 8 |
| | | | | | $Na_2O$ | 0.6 |

The soda lime glass, borosilicate glass, and alkali free glass substrates contain Na and O. Na and O diffuse from the substrate toward the first electrode during the heat treatment process of the first electrode, and thus present inside the first electrode and on a surface of the first electrode. Na and O diffusing to the first electrode further diffuses in grain boundaries of the light absorbing at the time of sulfurizing or selenizing process, and functions to passivate grain boundary defects generated in the grain boundaries of the light absorbing layer.

The grain boundaries of the light absorbing layer provide moving paths of electrons generated in the light absorbing layer at the time of solar light irradiation (Adv. Mater. 2012, 24, 720-723), but the defects in the light absorbing layer reduce mobility of the electrons. However, according to the manufacturing method of the present invention described as above, Na and O present on the surface of the first electrode passivate the defects in the light absorbing layer, thereby preventing the recombination of electrons and holes, and thus eventually improving current and internal voltage characteristics of the thin film solar cell device.

According to an embodiment of the present invention, the diffusion of Na or O is easily controlled through the heat treatment of the first electrode, thereby suppressing the generation of a mixed-phase compound in the interface of the first electrode and the light absorbing layer, and improving the light conversion efficiency characteristics of the thin film solar cell.

According to an embodiment of the present invention, in the step of forming the first electrode (S2), the first electrode (200) may be a metal (M) thin film. The metal (M) may be any one of molybdenum (Mo), nickel (Ni), tungsten (W), cobalt (Co), titanium (Ti), copper (Cu), gold (Au), and an alloy thereof. Preferably, the first electrode is a molybdenum (Mo) thin film. The molybdenum (Mo) thin film has excellent electric conductivity, resistive contact, heat resistance, and interface adhesion, and may be formed by sputtering. Meanwhile, the thickness of the first electrode may be 0.2 µm to 5 µm.

According to an embodiment of the present invention, in the step of heat-treating the first electrode (S3), the first electrode may be heated at a temperature of ⅓*Tm to ½*Tm based on the melting temperature (Tm) of the first electrode.

As the temperature for the heat treatment of the first electrode increases, the crystallinity of the first electrode almost proportionally increases. If the first electrode contains impurities, the recrystallizing temperature of the first electrode may be lower than the theoretical value thereof. The first electrode that has improved crystallinity through heat treatment suppresses the generation of a mixed-phase compound, which may be formed in an interface with the light absorbing layer at the time of subsequent heat treatment for sulfurization and selenization (S4).

According to an embodiment of the present invention, in step S3, the first electrode may be heat-treated under inert gas atmosphere of argon ($Ar_2$) or nitrogen ($N_2$) in a furnace. Preferably, the heat treatment may be conducted under argon ($Ar_2$) atmosphere. In the case where the heat treatment is conducted under oxygen atmosphere, M-O (metal-oxygen) crystals are generated between the first electrode and the light absorbing layer, causing unfavorable results.

According to an embodiment of the present invention, the first electrode may be heat-treated at a temperature of 400-600° C., and preferably within a temperature range of 500-600° C.

According to an embodiment of the present invention, the first electrode may be heat-treated under conditions of 400 to 760 Torr.

Figure 5:
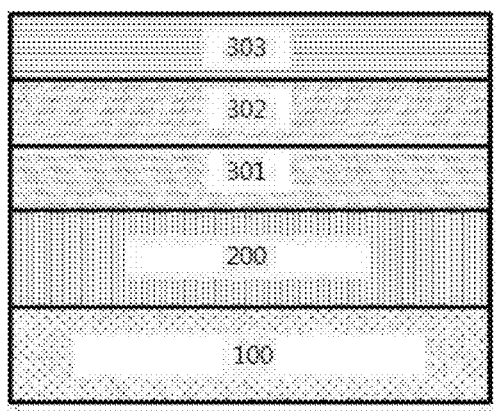
FIG. 5 is a cross-sectional view of an embodiment of a thin film solar cell in which a CTZ-based precursor is deposited.

Referring to FIG. 5, according to an embodiment of the present invention, in the step of depositing a metallic precursor (S4), a CZT-based metallic precursor layer is formed by sequentially depositing at least one Zn precursor (31), at least one Sn precursor (302), and at least one Cu precursor (303) on the first electrode (200). The metallic precursor layer may be formed by any one selected from sputtering, evaporation, chemical vapor deposition, metal organic chemical vapor deposition (MOCVD), close-spaced sublimation (CSS), spray pyrolysis, chemical spraying, screen printing, vacuum-free liquid-phase film deposition, chemical bath deposition (CBD), vapor transport deposition (VTD), and electrodeposition.

According to an embodiment of the present invention, the deposited metallic precursor layer is heat-treated under sulfurization or selenization gas atmosphere to form a light absorbing layer (S5). The sulfurizing or selenizing process may be conducted by heating and recrystallizing the metallic precursor layer at a temperature condition of 400-600° C. while sulfur (S) or selenium (S2) gas is supplied. The formed light absorbing layer of the thin film solar cell may be a CIS, CIGS, or CZTS based thin film.

Figure 10:
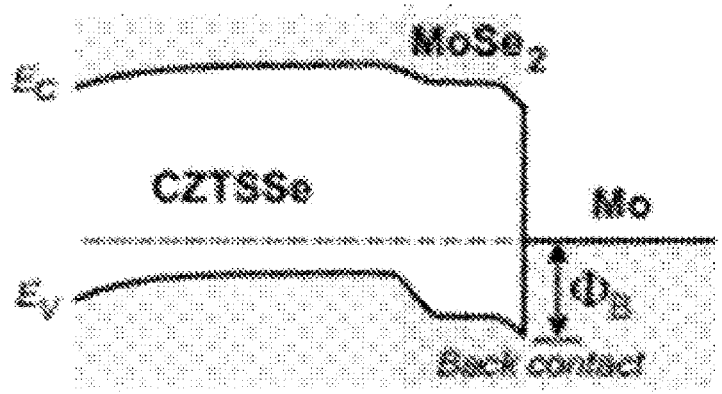
FIG. 10 is a back contact band diagram.

During the high-temperature sulfurizing or selenizing process, sulfur or selenium reacts with the first electrode, so that a mixed-phase compound ($M_xS_y$ or $M_xSe_y$) of sulfur or selenium and the first electrode is formed between the first electrode (M) and the light absorbing layer. The layer having the generated mixed-phase compound obstructs the flowing of holes, which move from the light absorbing layer to the first electrode. Back contact band diagram as shown in FIG. 10 shows a modification of an energy band gap due to the mixed-phase compound generated in the interface between the first electrode and the light absorbing layer. The band gap at the interface of the first electrode due to the mixed-phase compound of the first electrode and sulfur or selenium leads to an increase in the back contact bather height (ΦB), thereby obstructing the flowing of holes. An embodiment of the present invention has an advantage that the holes of the light absorbing layer smoothly escape to the first electrode by suppressing the generation of the mixed-phase compound.

According to another embodiment of the present invention, provided is a thin film solar cell having excellent light conversion efficiency.

The thin film solar cell includes a substrate, a first electrode, a light absorbing layer, a buffer layer, a window layer, and a second electrode. In addition, a compound layer of $M_xS_y$ or $M_xSe_y$ (here, M is metal, and x and y are a natural number) may be present in the interface between the first electrode and the light absorbing layer, and the thickness of the compound layer of $M_xS_y$ or $M_xSe_y$ may be 150 nm or less.

In an embodiment of the present invention, the thickness of the compound layer of $M_xS_y$ or $M_xSe_y$ is preferably 130 nm or less, and more preferably the compound layer of $M_xS_y$ or $M_xSe_y$ is not present.

In an embodiment of the present invention, the thickness of the first electrode may be 0.2 μm to 5 μm.

In an embodiment of the present invention, the light absorbing layer of the thin film solar cell may be CIS, CIGS, or CZTS.

In an embodiment of the present invention, the surface roughness of the first electrode may be 4 nm or less.

In an embodiment of the present invention, the sheet resistance value of the first electrode may be 0.7 ohms/square or less.

Hereinafter, the present invention is described through more specific examples.

Forming of First Electrode

Example 1

A soda lime glass substrate (100) was prepared, and a first electrode (200) of molybdenum (Mo) was deposited to have a thickness of about 0.5 μm on the substrate (100) through DC sputtering.

The first electrode was heat-treated at 400° C. for 10 minutes under nitrogen atmosphere.

Example 2

A first electrode was formed by the same method as in example 1 except that the first electrode was heat-treated at 600° C.

Comparative Example 1

A first electrode was formed by the same method as in example 1 except that the step of heat treating the first electrode was skipped.

Comparative Example 2

A first electrode was formed by the same method as in example 1 except that the first electrode was heat-treated at 200° C.

Figure 3:
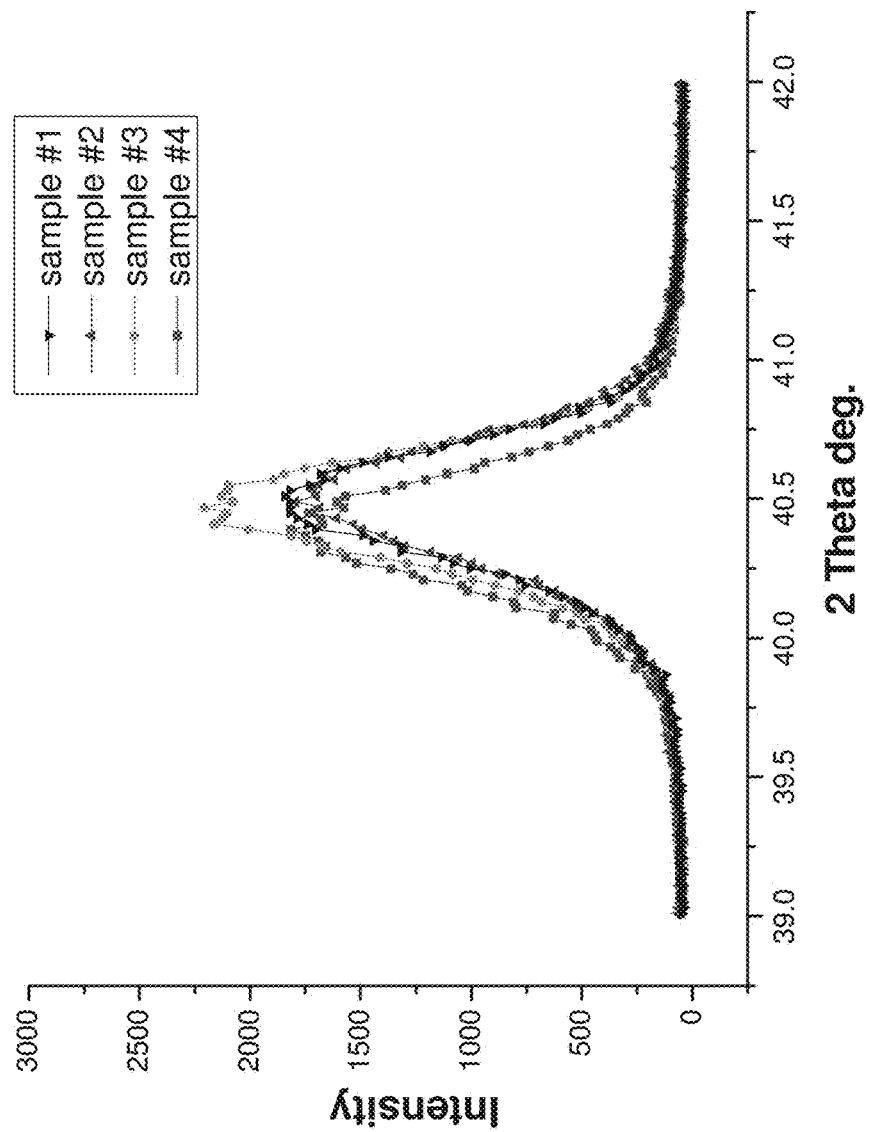
FIG. 3 shows an XRD graph of a first electrode after heat treatment in an example and a comparative example.

X-ray diffraction (XRD) analysis was conducted to verify crystallinity of the first electrodes formed in examples 1 and 2 and comparative examples 1 and 2. As shown in FIG. 3, it was verified that the intensity of the XRD peak increased in example 1 rather than in comparative examples 1 and 2, and thus the crystallinity of the first electrode increased. In example 2, the XRD peak shifts to the left, and thus the crystallinity of the first electrode changed.

Figure 4:
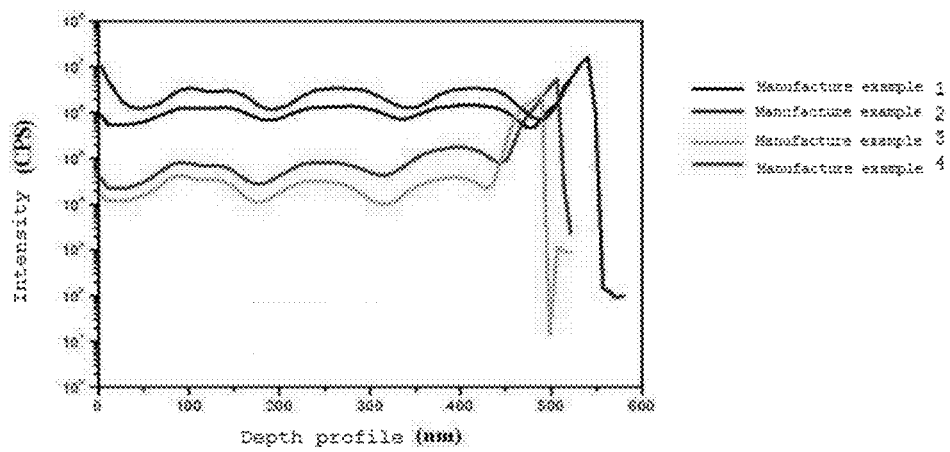
FIG. 4 shows a Na distribution diagram of the first electrode in examples 1 and 2 and comparative examples 1 and 2.

The Na distribution of the first electrode, which was measured through secondary ion mass spectrometry (SIMS), in examples 1 and 2 and comparative examples 1 and 2 are shown in FIG. 4. It can be verified that as the heat treatment temperature of the first electrode increased, the Na diffusion from the substrate to the first electrode increased. This means that more Na is distributed in the surface of the first electrode in examples 1 and 2 rather than in comparative examples 1 and 2.

Manufacturing of Thin Film Solar Cell

Manufacture Examples 1 to 4

A CZT-based metallic precursor layer was formed by sputter-depositing a Zn precursor (301), a Sn precursor (302), and a Cu precursor (303) on each of the first electrodes (200) formed in examples 1 and 2 and comparative examples in the order shown in FIG. 5.

Figure 6:
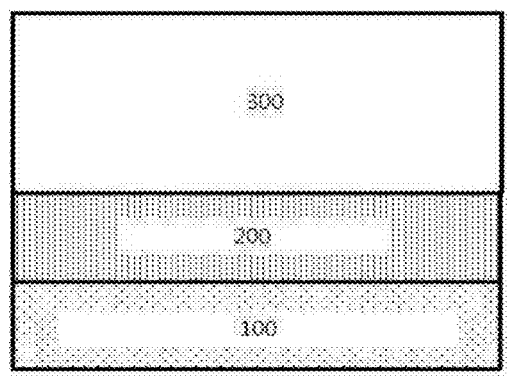
FIG. 6 is a cross-sectional view of an embodiment of a thin film solar cell having a light absorbing layer formed after a sulfurizing process.
Figure 7A:
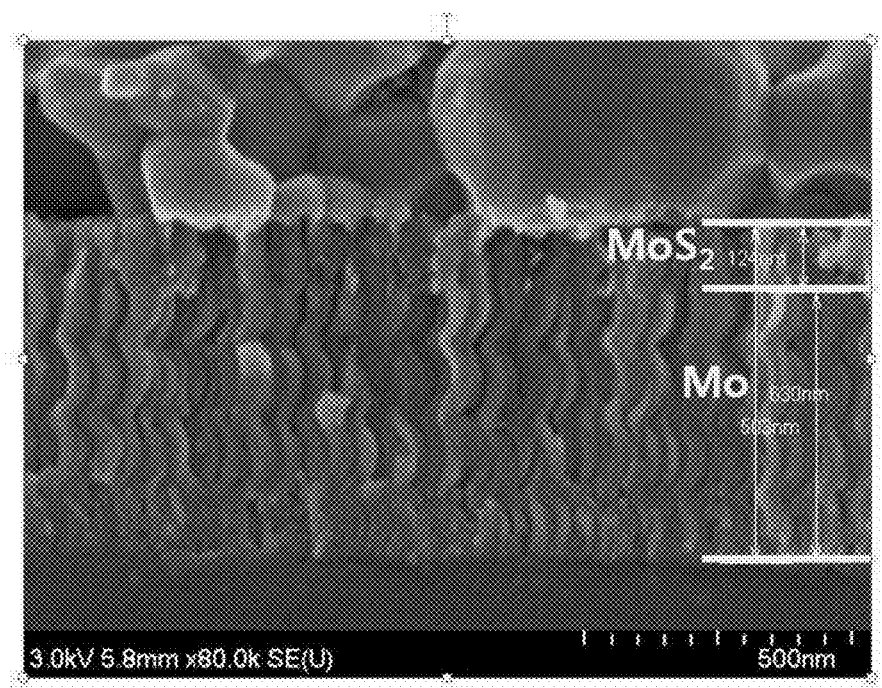
FIGS. 7A to 7D are SEM images of a rear electrode and a light absorbing layer in examples and comparative examples.
Figure 7B:
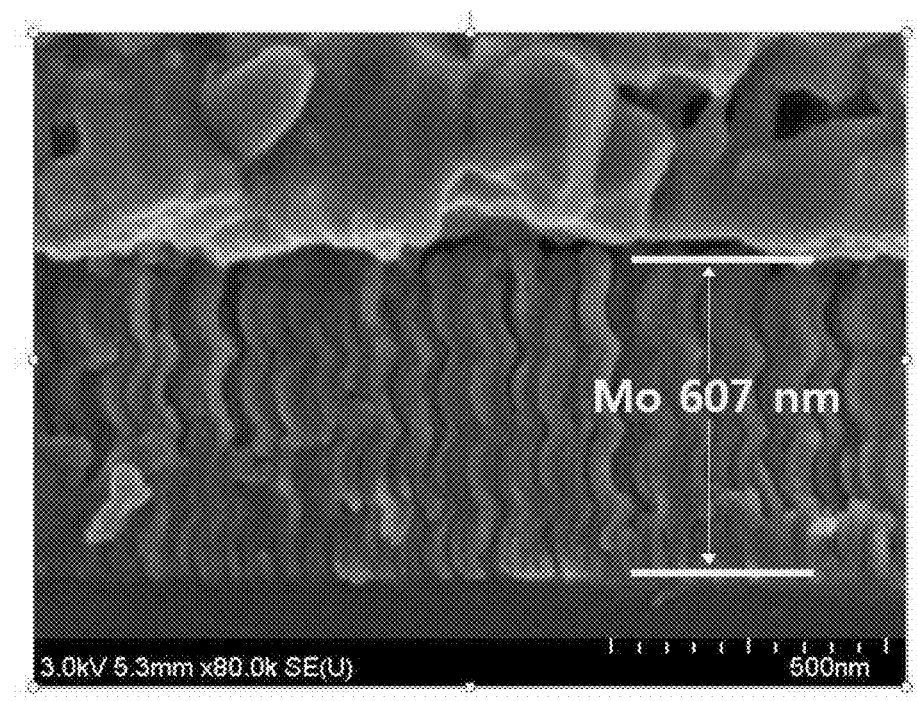
Figure 7C:
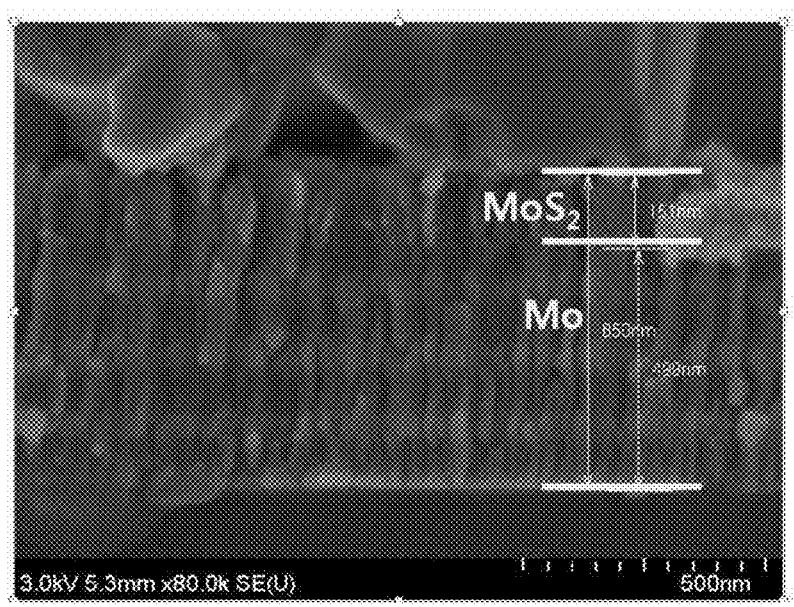
Figure 7D:
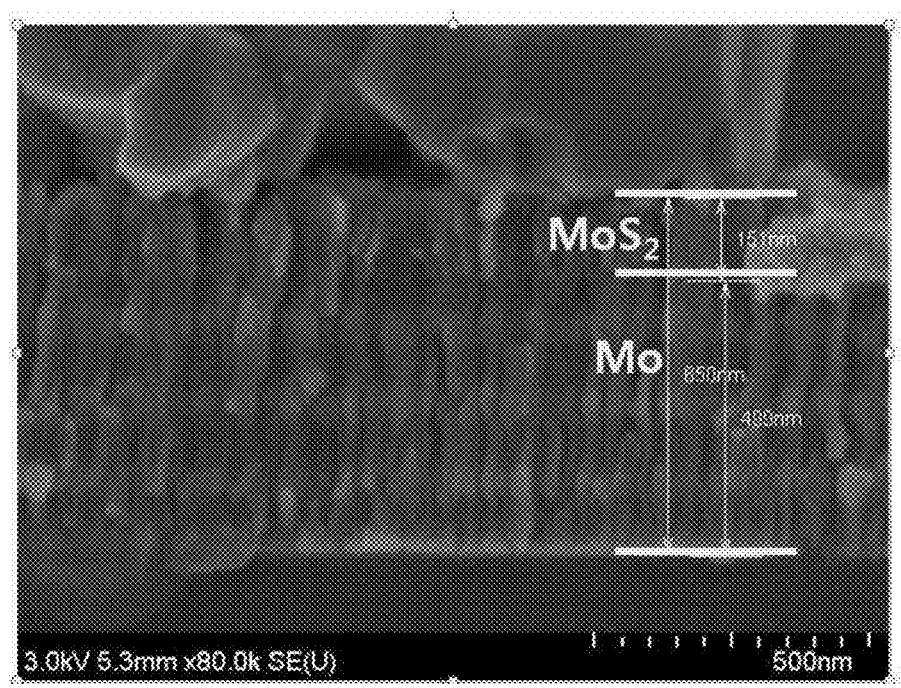

After that, the CZT-based metallic precursor layer was heat-treated according to a sulfurizing process. The heat treatment was conducted in a furnace including a first furnace and a second furnace. A sulfur (S) powder was heated at 300° C. in the first furnace, and the first electrode formed in example 1 was put in the second furnace, followed by a sulfurization treatment at a temperature of 600° C. As a result, as shown in FIG. 6, a CZTS-based light absorbing layer (300) was formed.

Then, a CdS buffer layer (400) of 60 nm, a ZnO window layer (500) of 400 nm, and an Al electrode (600) were formed on the CZTS-based light absorbing layer, thereby completing a CZTS-based thin film solar cell.

Photographing of SEM Image

FIGS. 7a to 7d are SEM images of the first electrodes and the light absorbing layers in the CZTS-based thin film solar cells manufactured in manufacture examples 1 to 4.

In example 1 (FIG. 7a), the thickness of the mixed-phase compound ($MoS_2$) layer was 124 nm.

In example 2 (FIG. 7b), the mixed-phase $M_xS_y$ can be confirmed on the SEM image.

In comparative examples 1 and 2 (FIGS. 7c and 7d), it was verified that the thickness of the $MoS_2$ layer was 151 nm, and the mixed-phase compound ($MoS_2$) was formed thicker compared with examples 1 and 2.

It was verified that, before the manufacture of the light absorbing layer, the heat treatment of the first electrode leaded to an improvement in crystallinity of the first electrode, and an excellent effect of suppressing the generation of $M_xS_y$, which is prone to form in an interface between a rear electrode and the light absorbing layer.

Characteristics of Thin Film Secondary Cell

Figure 8A:
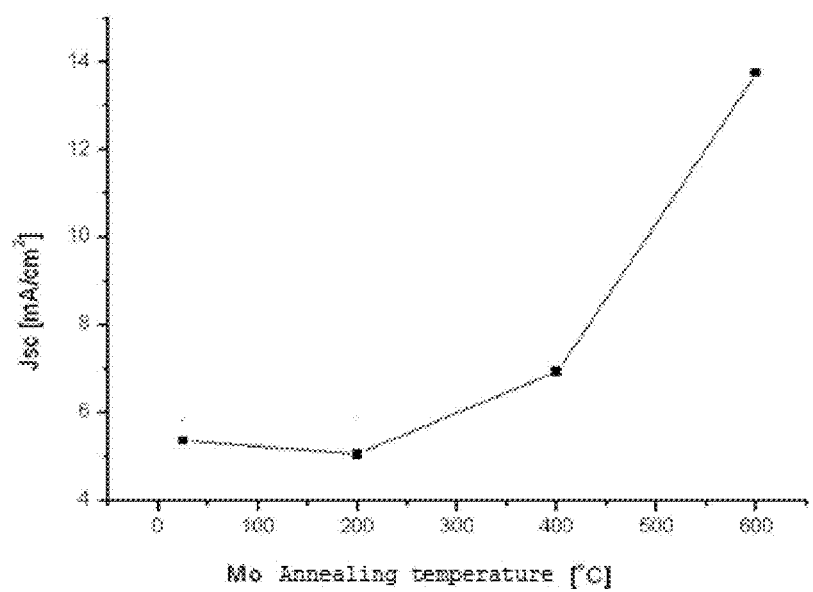
FIG. 8A shows short circuit characteristics of a CZTS-based thin film solar cell manufactured in manufacture example 2.
Figure 8B:
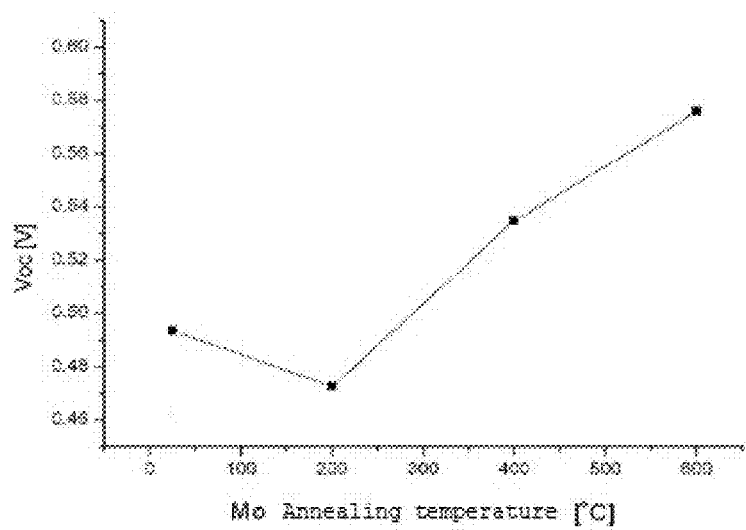
FIG. 8B shows open circuit voltage characteristics of a CZTS-based thin film solar cell manufactured in manufacture example 2.
Figure 8C:
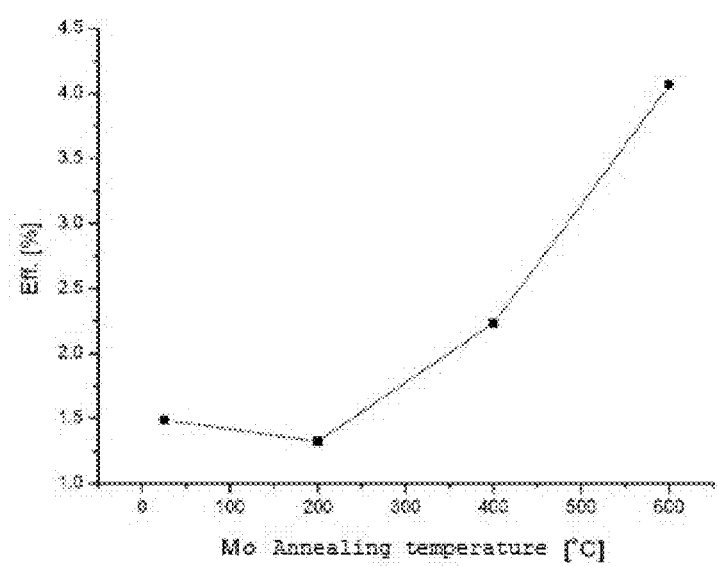
FIG. 8C shows efficiency characteristics of a CZTS-based thin film solar cell manufactured in manufacture example 2.

The opening voltage increased by 117%, the short current increased by 257%, and the light conversion efficiency increased by 273% in manufacture example 2 when compared with comparative example 1. The opening voltage (Voc), short current (Jsc), and efficiency in manufacture example 2 were shown in FIGS. 8a to 8c.

Figure 9:
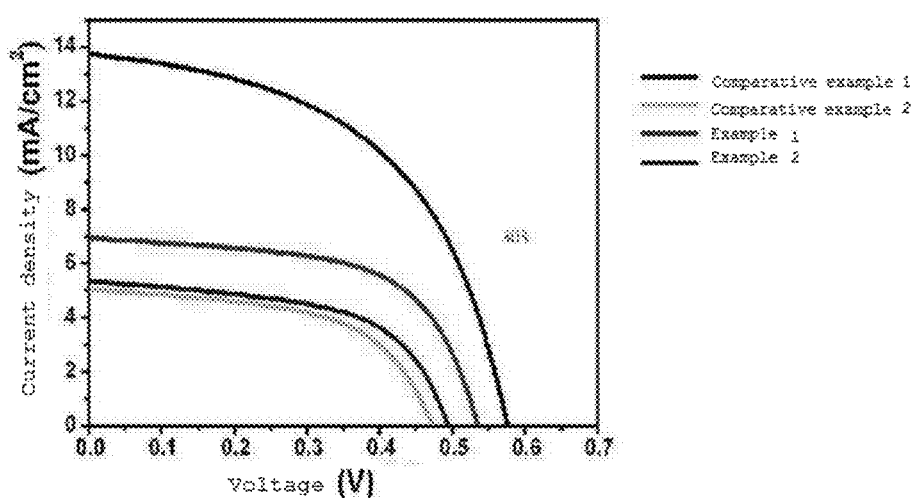
FIG. 9 is a graph showing current-voltage characteristics of thin film solar cells of manufacture examples 1 to 4.

In order to define current-voltage characteristics of the thin film solar cell devices manufactured in manufacture examples 1 to 4, the opening voltage (Voc), short current (Jsc), and efficiency were measured and then shown in FIG. 9.

As such, the electrical characteristics and efficiency of the thin film solar cell can be improved by suppressing the generation of the mixed-phase compound of $M_xS_y$ in the interface between the first electrode and the light absorbing layer and reducing the defects of the grain boundaries of the light absorbing layer.

In the case where the first electrode formed on the substrate is heat-treated, Na and O elements of the substrate migrate to the surface of the first electrode, and then passivate grain boundaries of the light absorbing layer at the time of heat treatment for sulfurization or selenization, thereby offsetting defects in the light absorbing layer. Thus, the current and voltage characteristics of the thin film solar cell device can be improved, and finally, the light conversion efficiency can be improved.

Although effects of the present invention have been described with reference to the accompanying examples, technical features of the present invention are not limited to the above-described specific embodiments, and variations and modifications are possible by any person skilled in the art to which the present invention belongs without deviating from the sprit and scope of the present invention set forth in claims, and thus, the examples described above should be construed as exemplifying, and not limiting the present disclosure. In addition, all changes and modifications from the meaning, range, and equivalent concept of the claims should be construed as being included in the present disclosure.

What is claimed is:

1. A method for manufacturing a CZTS-based thin film solar cell, the method comprising:
preparing a substrate including Na and O (S1);
forming a first electrode on the substrate (S2);
pre-heat-treating the first electrode at a temperature of ⅓*Tm to ½*Tm based on the melting temperature (Tm) of the first electrode (S3), such that Na and O from the substrate diffuses into the first electrode;
depositing a metallic precursor including Zn, Sn, Cu and S on the pre-heat-treated first electrode (S4); and
heat-treating the deposited metallic precursor layer under sulfurization or selenization gas atmosphere, to form a light absorbing layer (S5), such that Na and O diffusing to the first electrode further diffuses into a grain boundary in the light absorbing layer, a compound layer of MxSy or MxSey (here, M is metal, and x and y each are a natural number) is formed in an interface between the first electrode and the light absorbing layer, the thickness of the compound layer of MxSy or MxSey being 150 nm or less.

2. The method of claim 1, wherein the first electrode is a molybdenum (Mo) thin film.

3. The method of claim 1, wherein the temperature for the pre-heat treatment is 400-600° C.

4. The method of claim 1, wherein the temperature for the pre-heat treatment is 500-600° C.

5. The method of claim 1, wherein the pressure for the pre-heat treatment is 400-760 Torr.

6. The method of claim 1, wherein in step S4, a CZT-based metallic precursor layer is formed by sequentially depositing a Zn precursor, a Sn precursor, and a Cu precursor on the first electrode.

7. The method of claim 1, wherein the metallic precursor layer is formed by any one selected from sputtering, evaporation, chemical vapor deposition, metal organic chemical vapor deposition (MOCVD), close-spaced sublimation (CSS), spray pyrolysis, chemical spraying, screen printing, vacuum-free liquid-phase film deposition, chemical bath deposition (CBD), vapor transport deposition (VTD), and electrodeposition.

8. The method of claim 1, further comprising:
forming a buffer layer on the light absorbing layer (S6);
forming a window layer on the buffer layer (S7); and
forming a second electrode on the window layer (S8).

* * * * *